United States Patent [19]

Kalter et al.

[11] Patent Number: 4,566,022
[45] Date of Patent: Jan. 21, 1986

[54] FLEXIBLE/COMPRESSED ARRAY MACRO DESIGN

[75] Inventors: Howard L. Kalter, Colchester; Donald B. Kiley, Shelburne, both of Vt.

[73] Assignee: International Business Machines Corporation, Armonk, N.J.

[21] Appl. No.: 461,421

[22] Filed: Jan. 27, 1983

[51] Int. Cl.[4] .................... H01L 27/04; H01L 29/78
[52] U.S. Cl. .............................. 357/23.14; 307/303; 307/468; 357/23.9; 357/41; 357/45
[58] Field of Search ............ 357/41, 45, 23.14, 23.9, 357/23.4; 307/468, 469, 303; 364/716

[56] References Cited

U.S. PATENT DOCUMENTS

| | | | |
|---|---|---|---|
| 3,783,349 | 1/1974 | Beasom | 357/23 VD |
| 4,212,026 | 7/1980 | Balasubramanian et al. | 357/41 |
| 4,282,446 | 8/1981 | McElroy | 357/41 |
| 4,287,571 | 9/1981 | Chakravarti et al. | 357/23 VD |

OTHER PUBLICATIONS

Faggin, F. et al., *Solid–State Electronics*, Pergamon Press, 1970, vol. 13, pp. 1125–1143.

*Primary Examiner*—William D. Larkins
*Assistant Examiner*—E. Fallick
*Attorney, Agent, or Firm*—Joseph E. Kieninger; F. David LaRiviere

[57] ABSTRACT

A transistor array arrangement for providing high-density semiconductor logic circuits in double polysilicon technology is described. Semiconductor, for example, FET, logic circuits have four independent but simultaneously accessible FET devices which are formed by intersecting sets of polysilicon gate lines. The four FET devices share a common first diffusion, for example a source, surrounded by four logically independent second diffusions, for example drains. A three-bit decode device is made which includes this array design.

7 Claims, 3 Drawing Figures

FLEXIBLE/COMPRESSED ARRAY MACRO DESIGN

TECHNICAL FIELD

This invention relates to integrated semiconductor circuits and more particularly to a transistor array arrangement having a high cell density.

BACKGROUND ART

Integrated semiconductor circuits, particularly transistor arrays and memories having single transistor cells each of which represents a binary bit of information, as in read only memories (ROM), have achieved high device-per-cell densities. U.S. Pat. No. 4,193,125 describes a read only memory having a P-type substrate and a plurality of N+ type diffusion layers arranged checker-wise on one major surface of the substrate in which four N+-type diffusion layers having contacts are located at the corners of an imaginary rectangle and a fifth N+-type region having a contact formed substantially at the center of the imaginary rectangle. Between the fifth N+-type diffusion layer and the first to fourth N+-type diffusion layers, four MOS transistors are formed for the single contact. Gate lines are provided, each extending between adjacent two N+-type diffusion layers without overlapping them. Each of the four N+-type diffusion layers also acts as a central N+-type region of another imaginary rectangle adjacent to the first-mentioned imaginary rectangle. This patent teaches high-density, single polysilicon layout technique.

U.S. Pat. No. 4,287,571, assigned to the assignee of the present application, describes an array of transistors suitable for use in a read only memory including a plurality of spaced-apart first conductive lines insulated from a semiconductor substrate and a plurality of spaced-apart second conductive lines insulated from the substrate and from the first lines and disposed to intersect the first lines. Diffusion regions formed in the substrate as current carrying electrodes are defined by the first and second lines. A plurality of spaced-apart third conductive lines are arranged to intersect the first and second lines and to connect to the diffusion regions. When the array is used in a read only memory, selected transistors of the array are made to have a different threshold voltage from that of the remaining transistors and the first and second lines form word lines, the third lines form bit or sense and ground lines and the diffusion regions form the source and drain regions of the transistors, with each diffusion region serving up to four transistors or cells. This patent teaches the basic concept of a double polysilicon array having two sets of intersecting gates forming a plurality of interconnecting field effect transistors (FET) within a matrix of alternating source and drain regions. The array uses continuous angled first-level metal lines to interconnect all of the aligned source, or drain, regions along diagonals. Both depletion read only storage (ROS) and NOR ROS arrays are described. In this layout, all drain nodes are connected together in pairs. Hence, two devices are connected to one output. There are two independent circuits, that is, there are two output nodes.

SUMMARY OF THE INVENTION

A transistor array arrangement for providing high-density semiconductor logic circuits in double polysilicon technology is described. Semiconductor, for example, FET, logic circuits have four independent but simultaneously accessible FET devices which are formed by intersecting sets of polysilicon gate lines. The four FET devices share a common first diffusion, for example a source, surrounded by four logically independent second diffusions, for example drains. A three-bit decode device is made which includes this design array as well as logic circuits having one, two and three independent but simultaneously accessible FET devices. This three-bit decode device can be used in combination with another logic device to provide a progressive logic array (PLA).

BRIEF DESCRIPTION OF THE DRAWINGS

The invention will now be described by way of example and reference to the accompanying drawings in which.

DESCRIPTION OF THE PREFERRED EMBODIMENT

Figure 1:
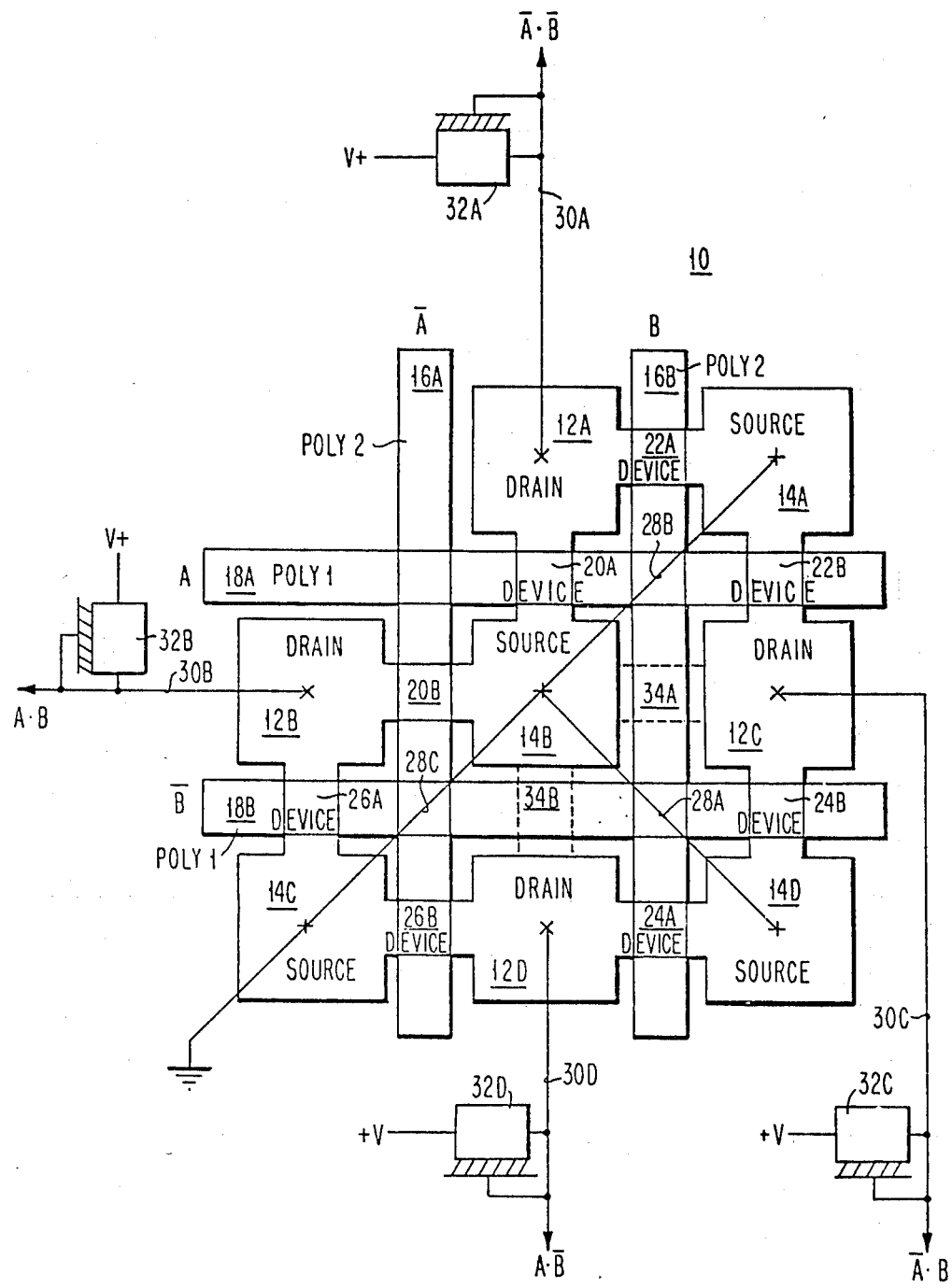
FIG. 1 is a plan view of a two-bit decode device and one embodiment in accordance with this invention.

As shown in FIG. 1, a two-bit decode device 10 in double polysilicon technology has drains 12A, 12B, 12C and 12D positioned about the four sides of source 14B. Sources 14A, 14C and 14D are positioned in a diagonal relationship to source 14B. Lines 18A and 18B in a first layer of doped polysilicon are parallel to each other and are positioned horizontally on either side of source 14B. Lines 16A and 16B in a second layer of doped polysilicon are parallel to each other and are positioned vertically on either side of source of 14B. Sources 14A, 14B, 14C and 14D are connected by ground line 28A, B and C as shown. The two-bit decode device has FET devices 20A and 20B, 22A and 22B, 24A and 24B, and 26A and 26B. Drains 12A, B, C and D are connected to output lines 30A, B, C and D which in turn are connected to voltage load devices 32A, B, C and D.

In accordance with this invention the device 10 is expanded to more powerful logic by adding at least one of the devices 34A and 34B which are positioned between source 14B and drain 12C and between source 14B and drain 12D respectively. The new arrangement which may include one or both of the FET devices 34A and 34B is the arrangement which permits the flexible/compressed array macro design as will be hereinafter more fully described.

The modified device 10 is made using conventional double polysilicon technology. The first step is to apply a mask for defining the drain, source and device regions. A thin oxide for the gates is then grown on the semiconductor substrate. A first layer of polysilicon is deposited on the oxide and etched to form the lines A and $\overline{B}$. After this pattern has been formed down to the bare silicon substrate, a oxide is regrown over the first layer of polysilicon. On top of the regrown oxide is deposited a second layer of polysilicon which is referred to as the poly 2 layer. The poly 2 layer is masked and etched to provide the $\overline{A}$, B lines as shown. The source and drain regions are then ionimplanted. After the implantation an oxide is deposited over the whole system. Contact holes are etched through the oxide and metal for conductor lines are deposited where required.

Figure 2:
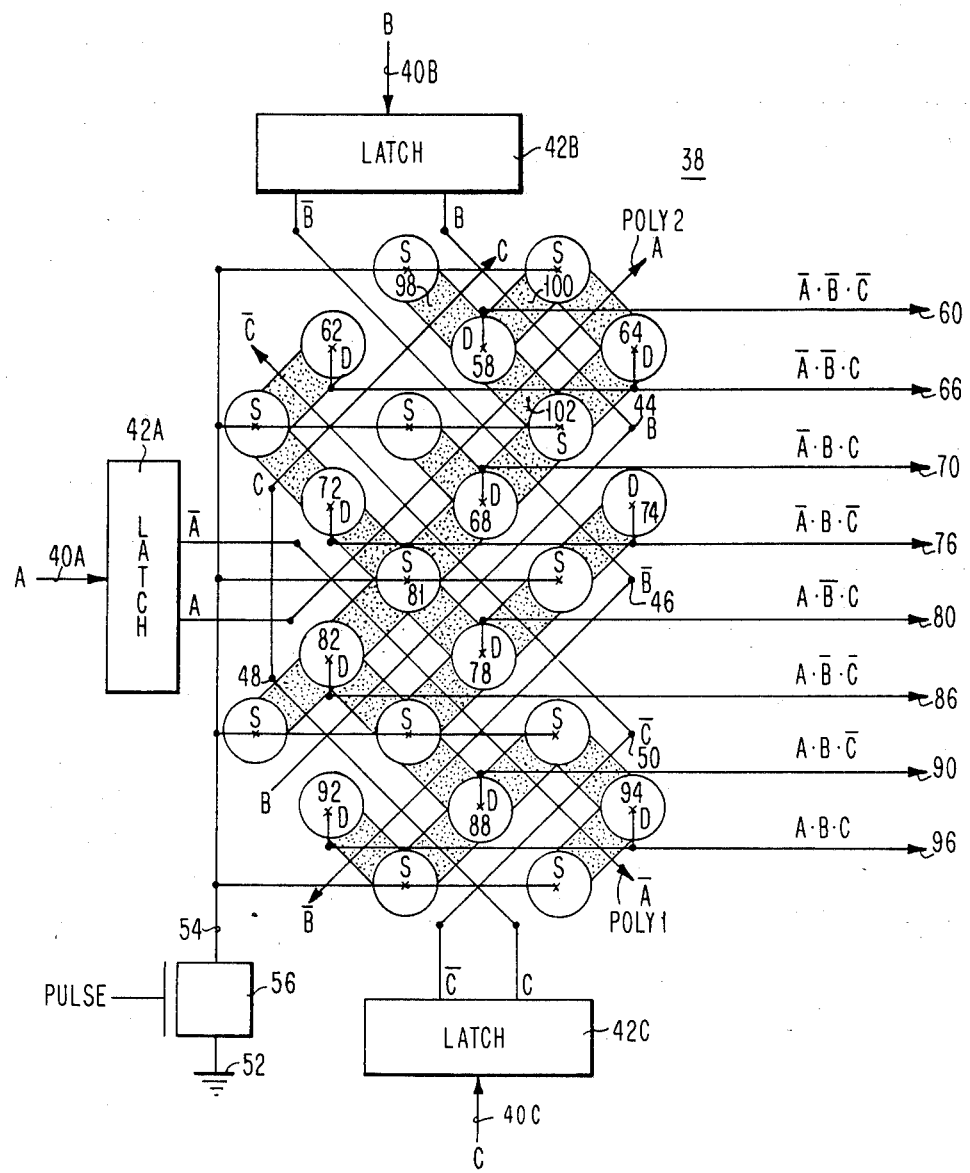
FIG. 2 is a schematic diagram of a three-bit decode device in accordance with this invention.

A three-bit decode (3×8) device 38 made in accordance with this invention is shown in FIG. 2. The device 38 has inputs 40A, 40B and 40C going to latches 42A, 42B and 42C respectively. Leaving latches 42A, B and C are word drivers A, $\overline{A}$, B, $\overline{B}$, C and $\overline{C}$ respectively. Line A proceeds in poly layer 2 diagonally upward to the right as shown. Line $\overline{A}$ proceeds in the polysilicon layer number 1 diagonally downward to the right as shown. Lines B and $\overline{B}$ proceed in poly layer 1 to poly 1/poly 2 contact points 44 and 46 respectively and then proceed in poly layer 2. Line C proceeds in poly layer 1 until poly contact point 48 and then in poly 2. Line $\overline{C}$ proceeds in poly 2 to poly/poly contact point 50 and then in polysilicon layer 1. All source regions have the letter S in them, all drains have the letter D in them and all source and drain contacts are identified with an X. All sources are connected to ground 52 by ground line 54 through device 56. Line 54 could be optionally connected directly to ground eliminating device 56, if a straight DC circuit is desired. Drain 58 is connected to output line 60 and is activated by A, B and C lines. Drains 62 and 64 are connected to output line 66 and are activated by A, B, C. Drain 68 is connected to output line 70. Drain 68 is activated by lines A, B, C. Drains 72 and 74 are connected to output line 76 and are operated by lines A, B, C. Drain 78 is connected to output line 80 and is activated by input lines A, B, C. Drain 82 is connected to output line 86 and is activated by input lines A, B and C. Drain 88 is connected to output line 90 and is activated by input lines A, B and C. Drains 92 and 94 are connected to output line 96 and are activated by input lines A, B and C. The drains are connected to the sources by one, two, three or four FET devices. For example, drain 58 is connected to three adjacent sources by FET devices 98, 100 and 102 respectively. Similarly, drains 68, 78, 82 and 88 are connected to adjacent sources by three drains. Drains 64, 72 and 94 are connected to sources by two FET devices. Drains 62, 92 and 74 are connected to one source by one FET device. Drains 72, 68, 78, 82, which are logically independent outputs, all have a common source 81 providing four independent devices serviced by one common source 81 diffusion. The source and drain regions have been arranged in such a way as to minimize the amount of silicon used. The compressed cell design shown in FIG. 2 minimizes the macro width by employing the diagonal polysilicon word line and thereby the output metal line impedances and lengths are also minimized. The first and second polysilicon input lines can also be cut to custom lengths to reduce average length of the signal paths. The meal output lines of the first array 60, 70, 66, 76, 96, 86, 90, and 80 matches the input pitch of the poly word lines of the second array as shown in FIG. 3.

Figure 3:
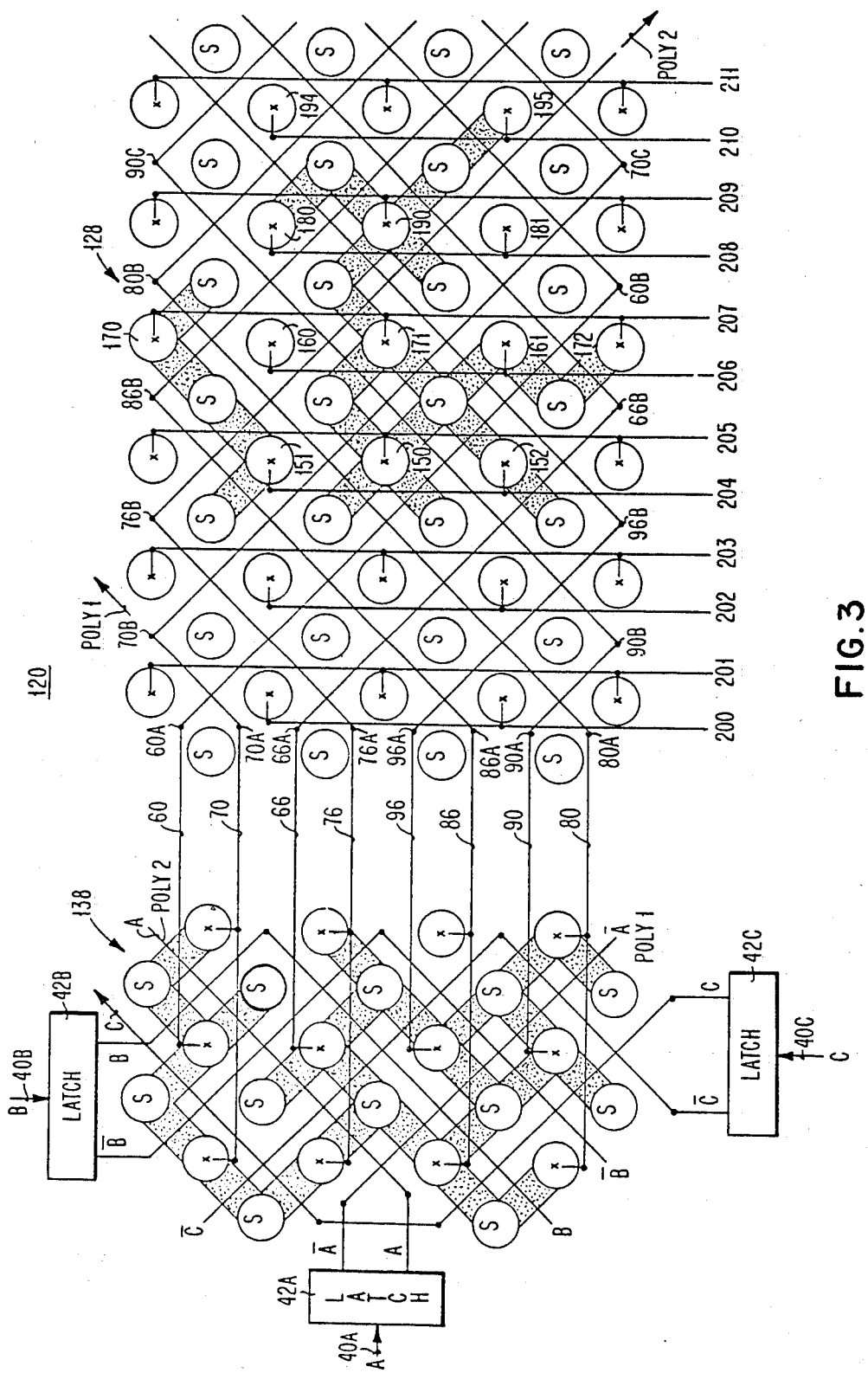
FIG. 3 is a schematic view of a second embodiment of this invention.

A PLA macro 120 consisting of a (3×8) decode device 138 interfacing with a (8×12) decode device 128 made in accordance with this invention is shown in FIG. 3. Device 138 is equivalent to device 38 in FIG. 2 except for a reordering of outputs 60, 66, 70, 76, 80, 86, 90 and 96 to 60, 70, 66, 76, 96, 86, 90 and 80. This is accomplished by some rearrangement of FET devices in the fixed source/drain device configuration. All source devices for devices 128 and 138 have diffusion to first metal contact to ground circuit 154. We have not included ground circuit 154 in the pictorial description of FIG. 3.

The eight input networks sinked to device 128 are first metal and sourced from device 138. Input nets 60, 66, 96 and 90 have first metal to poly 2 contacts 60A, 66A, 96A and 90A. Input nets 70, 76, 80 and 86 have first metal to poly 1 contacts 70A, 76A, 80A and 86A. All input nets to the 8×12 device 128 are connected to voltage load devices not shown, but as in FIG. 1. Poly 1 inputs 70, 76, 80 and 86 follow an incline path left to right to poly one poly two contacts 70B, 76B, 80B and 86B. Poly 2 inputs 60, 66, 96 and 90 follow a path decline path left to right to poly one poly two contacts 90B, 96B 66B and 60B. Lines 70C and 90C are the remaining poly one poly two contacts. First metal output lines 200 to 211 are connected to voltage node devices, not shown.

Drain 150 is connected to output line 205 and is activated by inputs 60, 70, 80 and 90. Logically, output 205 is a three way XOR of inputs A,B and C or sum of A+B+Carry. Drain 190 is connected to output line 209 and is activated by inputs 66, 76, 86 and 96. Logically, output 209 is a three way XNOR function.

Drains 151 and 152 are connected to output line 204 and is activated by inputs 60, 66, 76 and 86. Logically, this is a carry out of inputs A+B+Carryin to device 138. The combined output of lines 204 and 205 is a one bit arithmetic logic unit. The sum of inputs A, B and Carry in (C) give sum out on line 205 and Carry out on line 204.

Drains 160 and 161 are connected to output line 206 and is activated by input 60 and 96. Logically output 206 is inputs A,B and C are unequal. Drains 170, 171 and 172 are connected to output line 207 and is activated by inputs 80, 86, 76, 90, 70 and 66. Logically output 207 is inputs A, B and C are equal. Drains 180 and 181 are connected to output line 208 and is activated by 96. Logically output 208 states either A,B or C is zero. Drains 194 and 195 are connected to output line 210 and is activated by input 60. Logically output 210 states either A, B or C is a one. Outputs 200 to 203 and 211 are modeled as don't cares and have no function.

In one non-limiting example, drains 150 and 190 have devices connected to four sources. Drains 150, 171, 152 and 161 are connected to one source and the drains are logically independent.

In both device 138 the horizontally connecting grounding wires to the sources and in device 128 vertical connecting grounding wires to the sources are not shown to keep the figure less cluttered.

Although a preferred embodiment of this invention has been described, it is understood that numerous variations may be made in accordance with the principal of this invention.

What is claimed is:

1. An integrated circuit logic device comprising
a semiconductor substrate of a first conductivity type having a plurality of second conductivity type regions in a surface thereof;
said second conductivity type regions being bounded at least partially by at least two sets of intersecting conductive gate means which serve as input means to form a plurality of FET devices, at least some of which have one of said second regions as a common first current conducting electrode; and
at least three of the remaining second regions adjacent to said one second region forming the second current conducting electrode of three FET devices;
said second regions not being connected to each other.

2. A device as described in claim 1 including a fourth of the remaining second regions adjacent to said one second region forming the second current conducting electrode of a fourth FET device;

said fourth of the remaining second regions not being connected to any other of said second regions.

3. A device as described in claim 1 including a third set of intersecting conductive means connected to said second conductivity type regions which serve as output means.

4. A device as described in claim 1 wherein said sets of conductive gate means are made of polysilicon.

5. A device as described in claim 4 wherein said polysilicon is in two layers separated by an insulative layer.

6. A three-bit decode device comprising a semiconductor substrate of a first conductivity type having a plurality of second type conductivity type regions in a surface thereof;

three sets of intersecting conductive gate means positioned about said second conductivity type regions to form a plurality of FET devices, at least some of said FET devices having one of said second regions as a common first current conducting electrode, two sets of said intersecting means serving as input means and one set as output means; and at least three of the remaining second regions adjacent to said one second region forming the second current conducting electrode of three FET devices;

said second regions not being connected to each other.

7. A device as described in claim 6 including a fourth of the remaining second regions adjacent to said one second region forming the second current conducting electrode of a fourth FET device;

said fourth of the remaining second regions not being connected to any other of said second regions.

* * * * *

UNITED STATES PATENT AND TRADEMARK OFFICE
CERTIFICATE OF CORRECTION

PATENT NO. : 4,566,022
DATED : January 21, 1986
INVENTOR(S) : Howard L. Kalter and Donald B. Kiley It is certified that error appears in the above-identified patent and that said Letters Patent is hereby corrected as shown below:

IN THE SPECIFICATION:

Column 3, line 23, "A, B, C." should be --A, B, $\overline{C}$.--

Column 3, line 24, "A, B, C." should be --A, $\overline{B}$, $\overline{C}$.--

Column 3, line 26, "A, B, C." should be --A, $\overline{B}$, C.--

Column 3, line 27, "A, B, C." should be --$\overline{A}$, B, $\overline{C}$.--

Column 3, line 29, "A, B and C." should be --$\overline{A}$, B and C.--

Column 3, line 30, "A, B and C." should be --$\overline{A}$, $\overline{B}$ and C.--

Column 3, line 32, "A, B and C." should be --$\overline{A}$, $\overline{B}$ and $\overline{C}$.--

Column 3, line 51, "meal" should be -- metal --.

Signed and Sealed this

Second Day of September 1986

[SEAL]

Attest:

DONALD J. QUIGG

Attesting Officer  Commissioner of Patents and Trademarks